US012622197B2

(12) United States Patent
Tavakoli et al.

(10) Patent No.: US 12,622,197 B2
(45) Date of Patent: May 5, 2026

(54) METAL OXIDE CONVERSION FOR MEOL AND BEOL APPLICATIONS

(71) Applicant: Applied Materials, Inc., Santa Clara, CA (US)

(72) Inventors: Mohammad Mahdi Tavakoli, Santa Clara, CA (US); Chandan Das, Singapore (SG); Bencherki Mebarki, Santa Clara, CA (US); Joung Joo Lee, San Jose, CA (US); Jiecong Tang, Singapore (SG); Avgerinos V. Gelatos, Scotts Valley, CA (US)

(73) Assignee: Applied Materials, Inc., Santa Clara, CA (US)

(*) Notice: Subject to any disclaimer, the term of this patent is extended or adjusted under 35 U.S.C. 154(b) by 255 days.

(21) Appl. No.: 18/382,961

(22) Filed: Oct. 23, 2023

(65) Prior Publication Data

US 2025/0132146 A1 Apr. 24, 2025

(51) Int. Cl.
*H10P 70/00* (2026.01)
*H10P 14/60* (2026.01)
*H10P 50/26* (2026.01)

(52) U.S. Cl.
CPC .......... *H10P 70/27* (2026.01); *H10P 14/6314* (2026.01); *H10P 50/267* (2026.01)

(58) Field of Classification Search
CPC ......... H01L 21/02068; H01L 21/02244; H01L 21/32136

USPC ....................................................... 438/722
See application file for complete search history.

(56) References Cited

U.S. PATENT DOCUMENTS

| | | |
|---|---|---|
| 2015/0170914 A1 | 6/2015 | Haukka et al. |
| 2020/0340113 A1 | 10/2020 | Hatanpää et al. |
| 2022/0359381 A1 | 11/2022 | Li et al. |
| 2022/0411918 A1* | 12/2022 | Das .................. C23C 16/45523 |
| 2023/0015080 A1* | 1/2023 | Wang ................ H01J 37/32449 |
| 2023/0049702 A1* | 2/2023 | Williams ............ H01J 37/3244 |
| 2023/0081569 A1 | 3/2023 | Fan et al. |

FOREIGN PATENT DOCUMENTS

KR 20130112803 A 10/2013

OTHER PUBLICATIONS

International Search Report and Written Opinion dated Dec. 18, 2024 for Application No. PCT/US2024/046869.

* cited by examiner

*Primary Examiner* — Duy Vu N Deo
(74) *Attorney, Agent, or Firm* — Patterson + Sheridan, LLP

(57) ABSTRACT

A method of capping a metal layer includes performing a conversion process to reduce a metal oxide layer formed on a top surface of the metal layer and form a metal sulfide layer on the top surface of the metal layer, exposing the top surface of the metal layer to an oxidizing environment, and performing a removal process to remove the metal sulfide layer.

17 Claims, 4 Drawing Sheets

300

EXPOSE A TOP SURFACE OF A METAL LAYER TO AIR OR OTHER OXIDIZING ENVIRONMENT AND FORM A METAL OXIDE LAYER AT A TOP SURFACE OF THE METAL LAYER ⟋310

CONVERSION PROCESS: REDUCE THE METAL OXIDE LAYER AND FORM A CAP LAYER AT THE TOP SURFACE OF THE METAL LAYER ⟋320

EXPOSE THE METAL LAYER TO AIR OR OTHER OXIDIZING ENVIRONMENT ⟋330

REMOVAL PROCESS: REMOVE THE CAP LAYER ⟋340

300

EXPOSE A TOP SURFACE OF A METAL LAYER TO AIR OR OTHER OXIDIZING ENVIRONMENT AND FORM A METAL OXIDE LAYER AT A TOP SURFACE OF THE METAL LAYER — 310

CONVERSION PROCESS: REDUCE THE METAL OXIDE LAYER AND FORM A CAP LAYER AT THE TOP SURFACE OF THE METAL LAYER — 320

EXPOSE THE METAL LAYER TO AIR OR OTHER OXIDIZING ENVIRONMENT — 330

REMOVAL PROCESS: REMOVE THE CAP LAYER — 340

400
402S
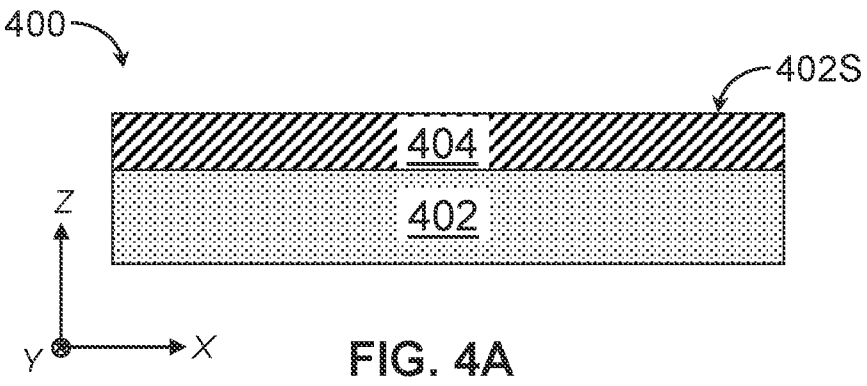
FIG. 4A
400
402S
406
402
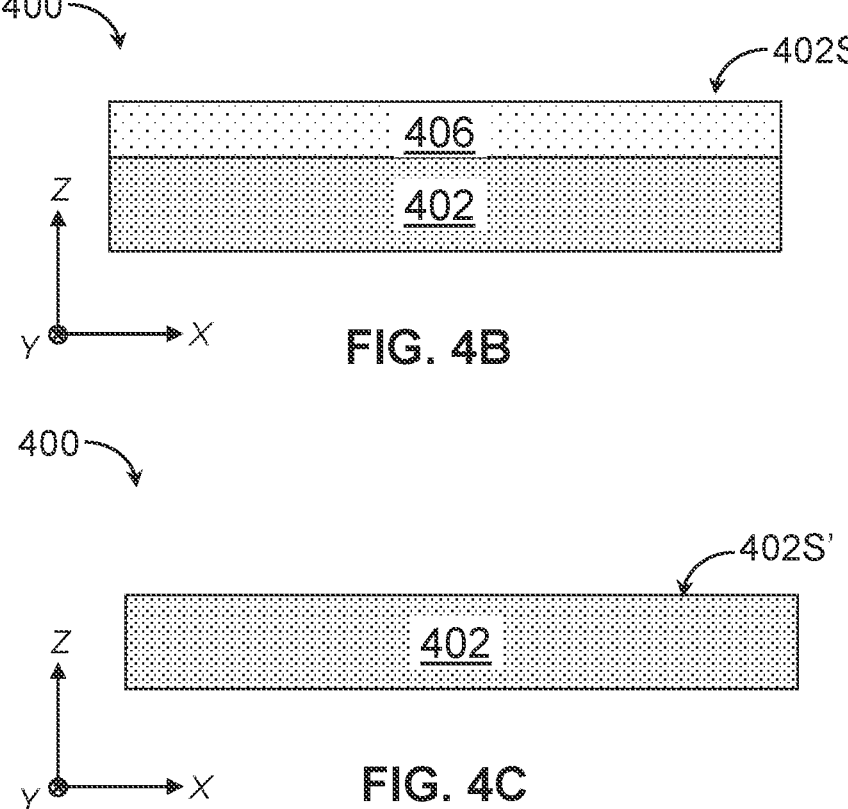
FIG. 4B
400
402S'
402
FIG. 4C

METAL OXIDE CONVERSION FOR MEOL AND BEOL APPLICATIONS

BACKGROUND

Field

Embodiments described herein generally relate to semiconductor device fabrication. More specifically, embodiments of the present disclosure relate to methods for converting a metal oxide layer to form a cap layer in middle-end-of-line (MEOL) and a back-end-of-line (BEOL) applications.

Description of the Related Art

In fabrication of an integrated circuit, middle-end-of-line (MEOL) and back-end-of-line (BEOL) stages may include forming gate regions of transistors and local interconnect layers with metal, such as tungsten (W) and molybdenum (Mo). Typically, fabrication process flows include vacuum breaks that cause oxidation of metal layers, forming isolating materials at interfaces. Conventionally, metal oxides at the interfaces are removed by a chemical soak using a precursor (e.g., tungsten chloride, tungsten fluoride, molybdenum chloride, molybdenum fluoride) followed by a plasma treatment. However, a chemical soak is a time-consuming process and causes size variation in post-soak features. In addition, a cleaned surface of a metal layer will be oxidized again if the surface of the metal layer undergoes another vacuum break.

Therefore, there is a need for efficient methods of removing metal oxides, such as tungsten oxide ($W_xO_y$) and molybdenum oxide ($MoO_x$), and protecting metal layers from further oxidation.

SUMMARY

Embodiments of the present disclosure provide a method of capping a metal layer. The method includes performing a conversion process to reduce a metal oxide layer formed on a top surface of the metal layer and form a metal sulfide layer on the top surface of the metal layer, exposing the top surface of the metal layer to an oxidizing environment, and performing a removal process to remove the metal sulfide layer.

Embodiments of the present disclosure provide a method of capping a metal layer. The method includes performing a conversion process to reduce a metal oxide layer formed on a top surface of the metal layer and form a cap layer on the top surface of the metal layer, exposing the top surface of the metal layer to an oxidizing environment, and performing a removal process to remove the cap layer.

Embodiments of the present disclosure provide a method of capping a metal layer. The method includes performing a conversion process to reduce a metal oxide layer formed on a top surface of the metal layer and form a metal sulfide layer on the top surface of the metal layer, and exposing the top surface of the metal layer to an oxidizing environment, wherein the conversion process comprises soaking the top surface of the metal layer in a precursor including hydrogen ($H_2$) and hydrogen sulfide ($H_2S$).

BRIEF DESCRIPTION OF THE DRAWINGS

So that the manner in which the above recited features of embodiments of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A, 4B, and 4C are schematic views of a portion of the semiconductor structure including a metal layer, corresponding to various states of the method of FIG. 3.

Figure 1:
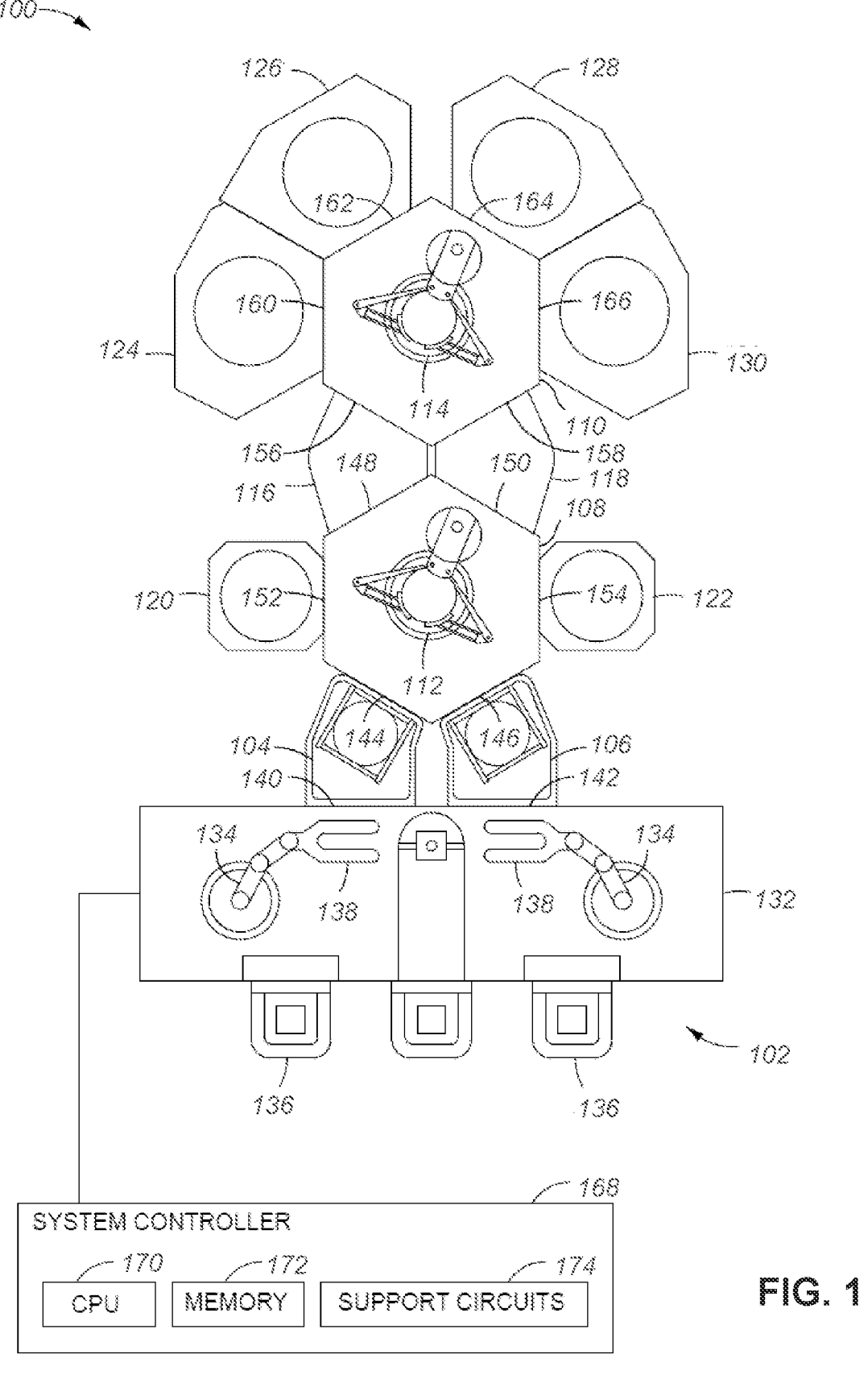
FIG. 1 is a schematic top view of a multi-chamber processing system, according to one or more embodiments of the present disclosure

To facilitate understanding, identical reference numerals have been used, where possible, to designate identical elements that are common to the figures. It is contemplated that elements and features of one embodiment may be beneficially incorporated in other embodiments without further recitation. In the figures and the following description, an orthogonal coordinate system including an X-axis, a Y-axis, and a Z-axis is used. The directions represented by the arrows in the drawings are assumed to be positive directions for convenience. It is contemplated that elements disclosed in some embodiments may be beneficially utilized on other implementations without specific recitation.

DETAILED DESCRIPTION

Embodiments of the present disclosure generally relate to converting a metal oxide layer (e.g., tungsten oxide ($W_xO_y$), molybdenum oxide ($MoO_x$)) formed at an interface of a gate region in a middle-end-of-line (MEOL) portion or an interconnect in a back-end-of-line (BEOL) portion of an integrated circuit, into a cap layer that protects the interface from further oxidation. The conversion process may be sulfurization of the metal oxides into metal sulfide (e.g., tungsten sulfide ($WS_2$), molybdenum sulfide ($MoS_2$)) that does not get oxidized and thus can act as a cap layer to protect the underlying metal layer from further oxidation in a vacuum break. This conversion process is a selective process that forms a cap layer only on a metal surface. The formed cap layer of metal sulfide (e.g., tungsten sulfide ($WS_2$), molybdenum sulfide ($MoS_2$)) is conductive semiconductor material and thus can be used as a barrier layer. The formed cap layer can be also removed, if needed after a vacuum break, by a plasma treatment.

PROCESSING SYSTEM EXAMPLE

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, and the processing chambers 124, 126, 128, 130 can be capable of performing respective deposition processes. The processing chamber 120 may be a Selectra® Etch chamber available from Applied Materials of Santa Clara, Calif. The processing chamber 122 may be an Aktiv® Preclean (APC) chamber, Preclean XT® chamber, or a SiCoNi® Pre-clean chamber available from Applied Materials of Santa Clara, Calif. The processing chamber 124, 126, 128, or 130 may be a *Trillium*® chamber, Centura® Epi chamber, Volta® CVD/ALD chamber, or Encore® PVD chambers available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general-purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Example Semiconductor Structure

Fabrication of an integrated circuit may include three stages: front-end-of-line (FEOL), middle-end-of-line (MEOL), and back-end-of-line (BEOL) stages. The MEOL stage may include forming gate regions of the transistors and local interconnect layers proximate to the semiconductor substrate to connect the transistors. The BEOL stage may include forming metal interconnect layers to connect the transistors and other devices of the integrated circuit.

Figure 2A:
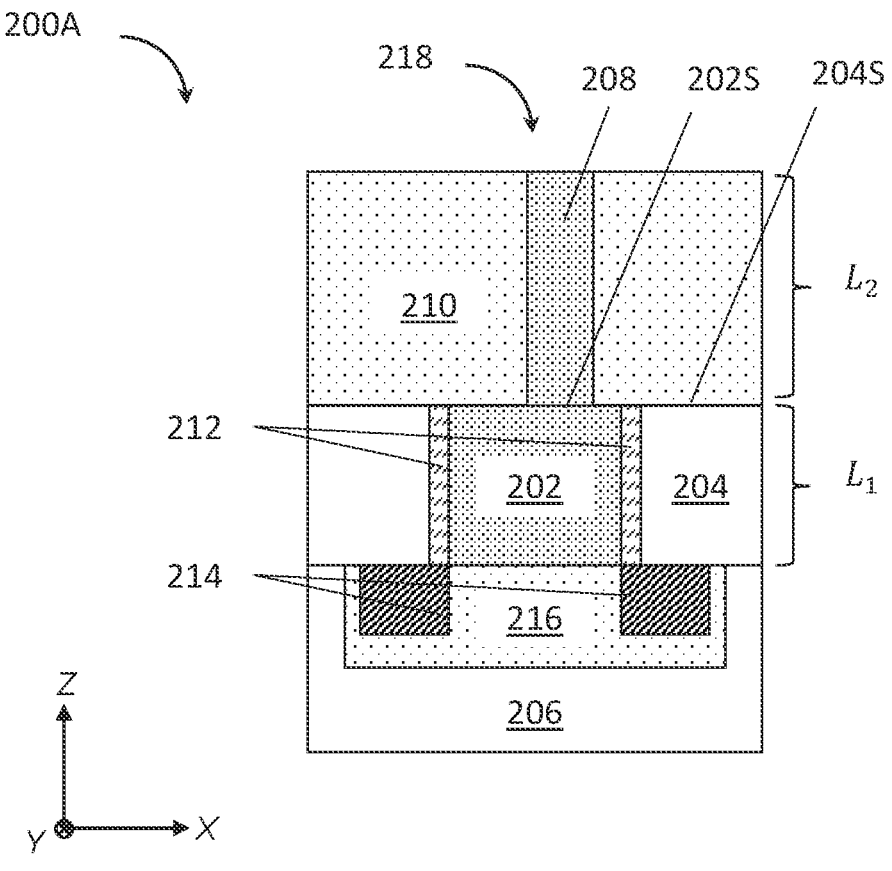
FIGS. 2A and 2B are schematic views of an exemplary semiconductor structure.
Figure 2B:
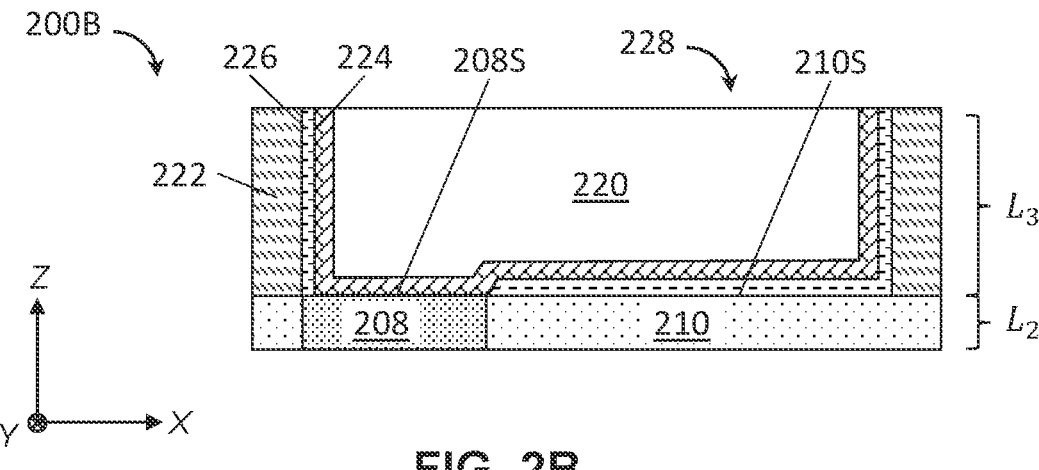

FIGS. 2A and 2B are schematic views of an exemplary semiconductor structure 200. FIG. 2A illustrates a MEOL portion 200A of the semiconductor structure. FIG. 2B illustrates a BEOL portion 200B of the semiconductor structure.

The MEOL portion 200A may include a first level $L_1$ that includes a metal layer 202 within a first dielectric layer 204 formed on a substrate 206, and a second level $L_2$ that includes an interconnect 208 within a second dielectric layer 210 formed on the first level $L_1$. The metal layer 202 and the interconnect 208 extend in the Y direction. In the first level $L_1$, liners 212 may be formed around the metal layer 202. The metal layer 202 and the interconnect 208 may be formed of molybdenum (Mo) or tungsten (W). The first dielectric layer 204 and the second dielectric layer 210 may be each formed of dielectric material such as silicon oxide ($SiO_2$), silicon nitride ($Si_3N_4$), or silicon oxynitride (SiON). The liners 212 may be formed of titanium nitride (TIN), tantalum nitride (TaN), or tungsten (W). The substrate 206 may include heavily doped regions 214 and a lightly doped region 216.

During the fabrication of the second level $L_2$, the semiconductor structure may be exposed to air or other oxidizing environment, and thus a top surface of the metal layer 202 at an interface of the first level $L_1$ and the second level $L_2$ may be oxidized. The top surface of the metal layer 202 expands in the X-Y plane and has a width in the X direction of between about 50 nm and about 100 nm.

The BEOL portion 200B may include the second level $L_2$ that includes the interconnect 208 formed within the second dielectric layer 210 and a third level $L_3$ that includes a metal layer 220 formed within a third dielectric layer 222. In the third level $L_3$, barrier layers 224 may be formed around the metal layer 220, and liners 226 may be formed around the barrier layers 224. The metal layer 220 may be formed of copper (Cu). The third dielectric layer 222 may be formed dielectric material such as silicon oxide ($SiO_2$), silicon nitride ($Si_3N_4$), or silicon oxynitride (SiON). The barrier layers 224 may be formed of titanium (Ti) or tantalum (Ta). The liners 226 may be formed of titanium nitride (TiN), tantalum nitride (TaN), or tungsten (W).

During the fabrication of the third level $L_3$, the semiconductor structure may be exposed to air or other oxidizing environment, and thus a top surface of the interconnect 208 at an interface of the second level $L_2$ and the third level $L_3$ may be oxidized. The top surface of the interconnect 208 expands in the X-Y plane and has a width in the X direction of between about 8 nm and about 30 nm.

Metal Oxide Conversion

Figure 3:
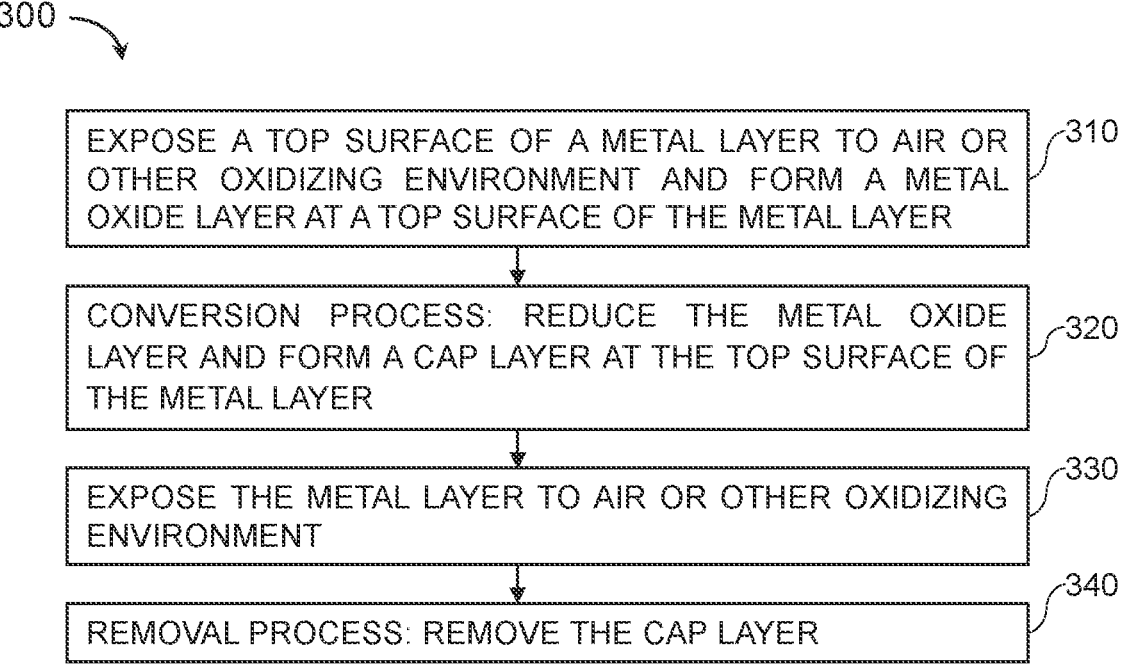
FIG. 3 depicts a process flow diagram of forming a semiconductor structure including a MEOL portion and/or a BEOL portion, according to one or more embodiments of the present disclosure.

FIG. 3 depicts a process flow diagram of a method 300 of forming a semiconductor structure 400 including a MEOL portion (e.g., the MEOL portion 200A shown in FIG. 2A) and/or a BEOL portion (e.g., the BEOL portion 200B shown in FIG. 2B), according to one or more embodiments of the present disclosure. The method 300 can be used to cap a metal surface, such as the top surface 202S of the metal layer 202 or the top surface 208S of the interconnect 208 (e.g., molybdenum (Mo) or tungsten (W)), to protect the top surface from further oxidation, in the fabrication steps.

FIGS. 4A, 4B, and 4C are schematic views of a portion of the semiconductor structure 400 including a metal layer 402 (e.g., the metal layer 202, the interconnect 208), corresponding to various states of the method 300. It should be understood that FIGS. 4A, 4B, and 4C illustrate only a partial schematic view of the semiconductor structure 400, which may contain any number of transistor sections and additional materials having aspects as illustrated in the figures. It should also be noted that although the method illustrated in FIG. 3 is described sequentially, other sequences that include one or more operations that have been omitted and/or added, and/or has been rearranged in another desirable order, fall within the scope of the embodiments of the disclosure provided herein.

The method 300 begins with block 310, in which a top surface 402S of the metal layer 402 (e.g., the top surface 202S of the metal layer 202, the top surface 208S of the interconnect 208) is exposed to air or other oxidizing environment and a metal oxide layer 404 is formed at a top surface 402S of the metal layer 402, as shown in FIG. 4A. The metal layer 402 may be formed of tungsten (W) or molybdenum (Mo). The metal oxide layer 404 on the metal layer 402 formed of tungsten (W) may be formed of tungsten oxide ($W_xO_y$). The metal oxide layer 404 on the metal layer 402 formed of molybdenum (Mo) may be formed of molybdenum oxide ($MoO_x$). The metal oxide layer 404 may have a thickness of between about 1 nm and about 3 nm. The metal oxide layer 404 expands in the X-Y plane and has a width in the X direction of between about 50 nm and about 100 nm, or between about 8 nm and about 30 nm.

In block 320, a conversion process is performed to reduce the metal oxide layer 404 and form a cap layer 406 at the top surface 402S of the metal layer 402, as shown in FIG. 4B. This conversion process is a selective process to grow the cap layer 406 on the top surface 402S of the metal layer 402, not on a dielectric layer (e.g., the first dielectric layer 204 shown in FIG. 2A, the second dielectric layer 210 shown in FIG. 2B).

The conversion process includes soaking the top surface 402S of the metal layer 402 in a precursor including hydrogen ($H_2$) and hydrogenated Group 16 element (e.g., sulfur (S), selenium (Se), tellurium (Te)), such as hydrogen sulfide ($H_2S$), hydrogen selenide ($H_2Se$), or hydrogen telluride ($H_2Te$), with a ratio of 1:1. The conversion process may be performed at a temperature of between about 250° C. and about 450° C., for example, about 350° C., at a pressure of between about 5 Torr and about 100 Torr, for example, about 5 Torr, for a time duration of between about 20 minutes and about 60 minutes. In the soaking process, a precursor is provided in a pulsing flow or a continuous flow in a CVD/ALD processing chamber, such as Trillium® chamber available from Applied Materials, Inc., of Santa Clara, Calif., or the processing chamber 124, 126, 128, or 130 shown in FIG. 1.

In the conversion process, the metal oxide layer 404 may be converted from the top surface 402S of the metal layer 402 to form a cap layer 406. The cap layer 406 on the metal layer 402 formed of tungsten (W) may be formed of tungsten sulfide ($WS_2$), tungsten selenide ($WSe_2$), or tungsten telluride (WTe$_2$). The cap layer 406 on the metal layer 402 formed of molybdenum may be formed of molybdenum sulfide (MoS$_2$), molybdenum selenide (MoSe$_2$), or molybdenum telluride (MoTe$_2$). The cap layer 406 may have a thickness of between about 1 nm and about 4 nm. The cap layer 406 expands in the X-Y plane and has a width in the X direction of between about 50 nm and about 100 nm, or between about 8 nm and about 30 nm.

In block 330, the metal layer 402 (e.g., the metal layer 202, the interconnect 208) is exposed to air or other oxidizing environment. During the exposure, the cap layer 406 (e.g., tungsten sulfide (WS$_2$), molybdenum sulfide (MoS$_2$)) does not get oxidized and thus protects the metal layer 202 from oxidation.

In block 340, a removal process is performed to remove the cap layer 406, as shown in FIG. 4C. The removal process includes exposing the top surface 402S of the metal layer 402 to a plasma formed from a process gas including hydrogen (H$_2$) gas and argon (Ar) gas. The plasma treatment process may be an inductively coupled plasma (ICP) process performed in a processing chamber, such as Preclean XT® chamber available from Applied Materials of Santa Clara, Calif., or the processing chamber 124, 126, 128, or 130 shown in FIG. 1. The plasma treatment process may be a capacitively coupled plasma (CCP) process performed in a processing chamber, such as Volta® chamber available from Applied Materials of Santa Clara, Calif., or the processing chamber 124, 126, 128, or 130 shown in FIG. 1. The plasma treatment process may be a remote plasma assisted process performed in a processing chamber, such as Volta® chamber, MCxT® chamber, Preclean XT® chamber available from Applied Materials of Santa Clara, Calif., or the processing chamber 122 shown in FIG. 1. The removal process may be a low energy ((e.g., less than about 50 eV) plasma treatment to protect an underlying surface 402S' of the metal layer 402.

In some embodiments, the formed cap layer 406 is not removed. The cap layer 406 (e.g., tungsten sulfide (WS$_2$), molybdenum sulfide (MoS$_2$)) is conductive semiconductor material and thus can be used as a barrier layer in an integrated circuit.

In the embodiments of the present disclosure, methods of capping a metal layer (e.g., tungsten (W), molybdenum (Mo)) in middle-end-of-line (MEOL) and a back-end-of-line (BEOL) applications are provided. The methods include converting a metal oxide layer (e.g., tungsten oxide (W$_x$O$_y$), molybdenum oxide (MoO$_x$)) formed at an interface of a gate region in a middle-end-of-line (MEOL) portion or an interconnect in a back-end-of-line (BEOL) portion of an integrated circuit, into a cap layer. The cap layer protects the interface from further oxidation. The conversion process may be sulfurization of the metal oxides into metal sulfide (e.g., tungsten sulfide (WS$_2$), molybdenum sulfide (MoS$_2$)) that does not get oxidized and thus can act as a cap layer to protect the underlying metal layer from further oxidation in a vacuum break. This conversion process is a selective process that forms a cap layer only on a metal surface. The formed cap layer of metal sulfide (e.g., tungsten sulfide (WS$_2$), molybdenum sulfide (MoS$_2$)) is conductive semiconductor material and thus can be used as a barrier layer. The formed cap layer can be also removed, if needed after a vacuum break, by a plasma treatment.

While the foregoing is directed to embodiments of the present disclosure, other and further embodiments of the disclosure may be devised without departing from the basic scope thereof, and the scope thereof is determined by the claims that follow.

We claim:

1. A method of capping a metal layer, comprising:
   performing a conversion process to reduce a metal oxide layer formed on a top surface of the metal layer and form a metal sulfide layer on the top surface of the metal layer;
   exposing the top surface of the metal layer to an oxidizing environment; and
   performing a removal process to remove the metal sulfide layer.

2. The method of claim 1, wherein
   the metal layer comprises tungsten (W),
   the metal oxide layer comprises tungsten oxide, and
   the metal sulfide layer comprises tungsten sulfide (WS$_2$).

3. The method of claim 1, wherein
   the metal layer comprises molybdenum (Mo),
   the metal oxide layer comprises molybdenum oxide,
   the metal sulfide layer comprises molybdenum sulfide (MoS$_2$).

4. The method of claim 1, wherein the conversion process comprises soaking the top surface of the metal layer in a precursor including hydrogen (H$_2$) and hydrogen sulfide (H$_2$S).

5. The method of claim 4, wherein the conversion process is performed at a temperature of between 250° C. and 450° C., at a pressure of between 5 Torr and 100 Torr, for a time duration of between 20 minutes and 60 minutes.

6. The method of claim 1, wherein the removal process comprises exposing the top surface of the metal layer to a plasma formed from a process gas including hydrogen (H$_2$) gas and argon (Ar) gas.

7. The method of claim 1, wherein the metal oxide layer has a thickness of 1 nm and 3 nm.

8. The method of claim 1, wherein the metal sulfide layer has a thickness of 1 nm and 4 nm.

9. A method of capping a metal layer, comprising:
   performing a conversion process to reduce a metal oxide layer formed on a top surface of the metal layer and form a cap layer on the top surface of the metal layer;
   exposing the top surface of the metal layer to an oxidizing environment; and
   performing a removal process to remove the cap layer, wherein
   the metal layer comprises tungsten (W),
   the metal oxide layer comprises tungsten oxide, and
   the cap layer comprises tungsten sulfide (WS$_2$), tungsten selenide (WSe$_2$), or tungsten telluride (WTe$_2$).

10. The method of claim 9, wherein the conversion process comprises soaking the top surface of the metal layer in a precursor including hydrogen (H$_2$) and hydrogen sulfide (H$_2$S), hydrogen selenide (H$_2$Se), or hydrogen telluride (H$_2$Te).

11. The method of claim 10, wherein the conversion process is performed at a temperature of between 250° C. and 450° C., at a pressure of between 5 Torr and 100 Torr, for a time duration of between 20 minutes and 60 minutes.

12. The method of claim 9, wherein the removal process comprises exposing the top surface of the metal layer to a plasma formed from a process gas including hydrogen (H$_2$) gas and argon (Ar) gas.

13. The method of claim 9, wherein the metal oxide layer has a thickness of between 1 nm and 3 nm.

14. The method of claim 9, wherein the cap layer has a thickness of between 1 nm and 4 nm.

15. A method of capping a metal layer, comprising:

performing a conversion process to reduce a metal oxide layer formed on a top surface of the metal layer and form a cap layer on the top surface of the metal layer;

exposing the top surface of the metal layer to an oxidizing environment; and performing a removal process to remove the cap layer, wherein the metal layer comprises molybdenum (Mo), the metal oxide layer comprises molybdenum oxide, the cap layer comprises molybdenum sulfide ($MoS_2$), molybdenum selenide ($MoSe_2$), or molybdenum telluride ($MoTe_2$).

16. The method of claim 15, wherein the conversion process is performed at a temperature of between 250° C. and 450° C., at a pressure of between 5 Torr and 100 Torr, for a time duration of between 20 minutes and 60 minutes.

17. The method of claim 15, wherein the conversion process comprises soaking the top surface of the metal layer in a precursor including hydrogen ($H_2$) and hydrogen sulfide ($H_2S$), hydrogen selenide ($H_2Se$), or hydrogen telluride ($H_2Te$).

\*    \*    \*    \*    \*